(12) United States Patent
Tian et al.

(10) Patent No.: US 11,658,005 B2
(45) Date of Patent: May 23, 2023

(54) METHOD FOR CONTROLLING DYNAMICALLY CONTROLLABLE ULTRAWIDE-AMPLITUDE AND HIGH-RESPONSE ION SOURCE

(71) Applicant: National University of Defense Technology, People's Liberation Army of China, Hunan (CN)

(72) Inventors: Ye Tian, Hunan (CN); Feng Shi, Hunan (CN); Guangqi Zhou, Hunan (CN); Ci Song, Hunan (CN); Guipeng Tie, Hunan (CN); Gang Zhou, Hunan (CN)

(73) Assignee: NATIONAL UNIVERSITY OF DEFENSE TECHNOLOGY, PEOPLE'S LIBERATION ARMY OF CHINA, Hunan (CN)

( * ) Notice: Subject to any disclaimer, the term of this patent is extended or adjusted under 35 U.S.C. 154(b) by 15 days.

(21) Appl. No.: 17/471,540

(22) Filed: Sep. 10, 2021

(65) Prior Publication Data
US 2022/0384141 A1    Dec. 1, 2022

(30) Foreign Application Priority Data
May 24, 2021    (CN) .......................... 202110565566.9

(51) Int. Cl.
*H01J 37/304*    (2006.01)
*H01J 37/305*    (2006.01)

(52) U.S. Cl.
CPC .......... *H01J 37/304* (2013.01); *H01J 37/305* (2013.01); *H01J 2237/2487* (2013.01)

(58) Field of Classification Search
CPC . H01J 37/304; H01J 37/305; H01J 2237/2487
See application file for complete search history.

(56) References Cited

U.S. PATENT DOCUMENTS 7,449,699 B1 * 11/2008 Adams .................. H01J 37/228
250/492.23

FOREIGN PATENT DOCUMENTS

CN    110444459 A  * 11/2019    ............ H01J 37/304

* cited by examiner

*Primary Examiner* — Sean M Luck
(74) *Attorney, Agent, or Firm* — John Maldjian; Stevens & Lee PC

(57) ABSTRACT

The present disclosure provides a system and method for controlling a dynamically controllable ultrawide-amplitude and high-response ion source, including: resolving dwell time of ion beam machining during iterative machining; selecting an appropriate velocity V of a movable shaft of a machine tool according to a calculation result of the dwell time; and dynamically calculating process parameters of an ion source according to an initial surface error of an optical component and the velocity V of the movable shaft, and generating a corresponding numerical control (NC) program to machine the optical component. The present disclosure can control the removal function of the ion beam polishing in real time, improve the precision and efficiency of the ion beam polishing, and further reduce the requirement on a movement system of the machine tool and the depth of a damaged layer.

20 Claims, 13 Drawing Sheets

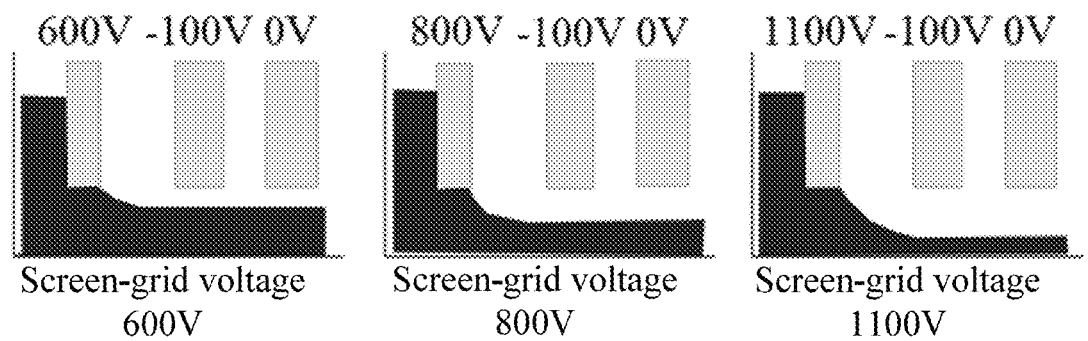
FIG. 2
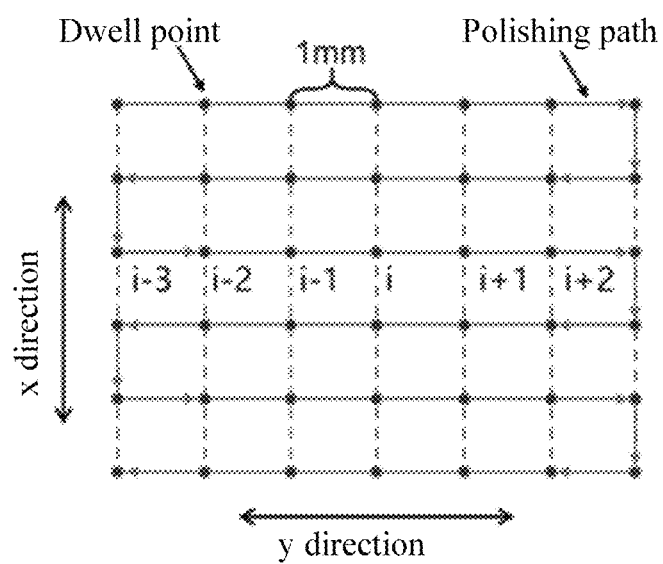
FIG. 3(a): scanning path

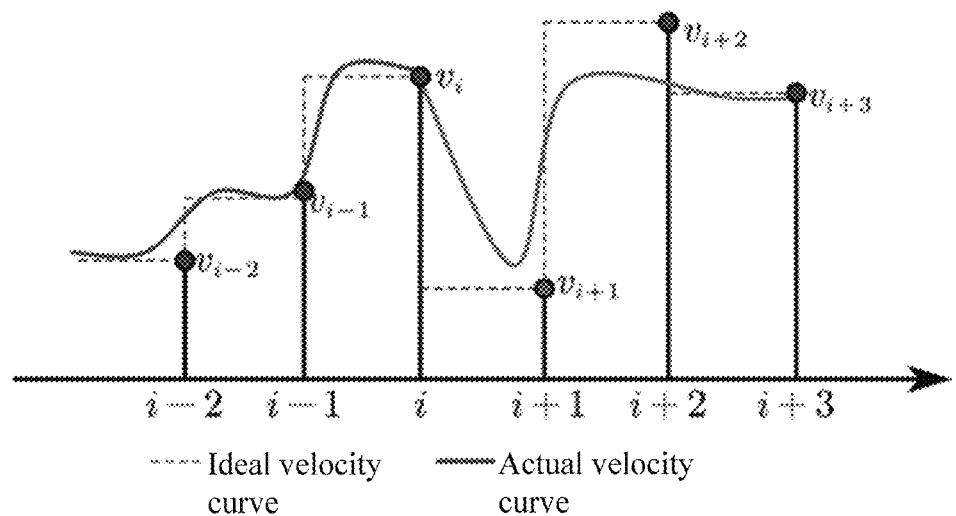
FIG. 3(b): scanning velocity curve
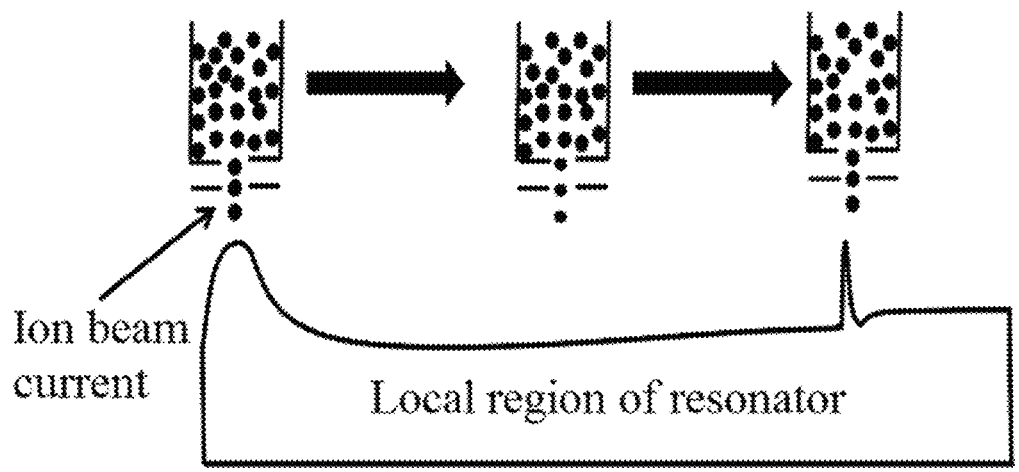
FIG. 4

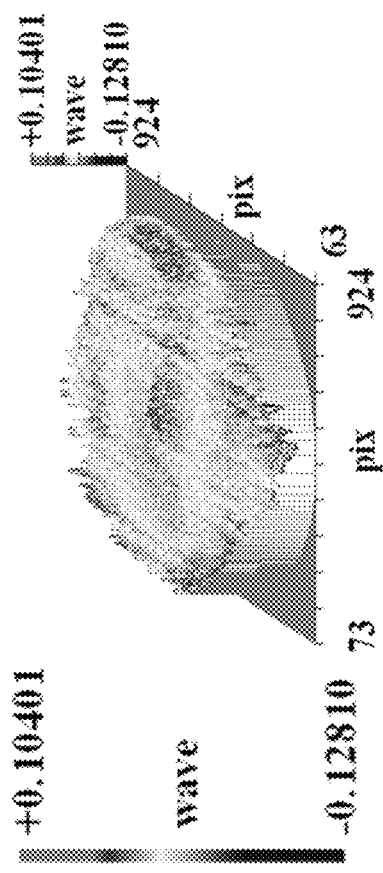
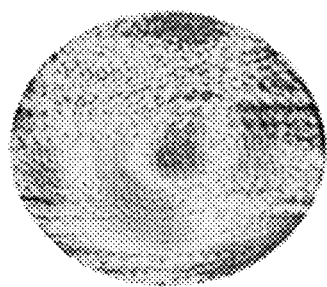
FIG. 9

METHOD FOR CONTROLLING DYNAMICALLY CONTROLLABLE ULTRAWIDE-AMPLITUDE AND HIGH-RESPONSE ION SOURCE

CROSS REFERENCE TO RELATED APPLICATION

This patent application claims the benefit of, and priority from, Chinese Patent Application No. 202110565566.9, filed May 24, 2021, the disclosure of which is incorporated by reference herein in its entirety as part of the present application.

TECHNICAL FIELD

The present disclosure belongs to ultraprecise ion beam machining technologies, and in particular, relates to a method for controlling a dynamically controllable ultrawide-amplitude and high-response ion source.

BACKGROUND ART

The basic principle of ion beam polishing is to bombard an optical surface with energetic ions, such that the complex collisions of ions with surface atoms take place, and there is exchange of momentum and energy with material atoms through the collisions. After obtaining enough energy, the collided surface atoms can get rid of constraints of surface energy and break away from the workpiece surface, thereby removing the materials atomically. With the high certainty, high stability, non-contact and no stress, the ion beam polishing method is more advantageous over the conventional polishing technology in many aspects. It overcomes the defects of edge effect, tool wear, pressure load and so on in the conventional polishing process and possesses apparent advantages in many regards.

With regard to high-precision figuring: for multi-band surface errors, existing ion beam polishing typically obtains removal functions of different beam diameters by adding diaphragms. Any change of the removal function will additionally increase the preparation time for machining. Moreover, as the removal function of each beam diameter will scan and machine the whole surface, components are remeasured whenever the beam diameter changes, and the clamping error arising from repeated clamping of the optical components is introduced, which reduces the figuring precision and the ion beam polishing efficiency. For a region with the large error gradient, insufficient dynamic performance of the machine tool will lead to a machining error, such that the surface cannot reach the anticipated convergence effect or even the original quality of the surface is affected.

With regard to mass trimming: the hemispherical resonator gyro (HRG) is a solid vibration gyro with the highest precision at present. The HRG mainly includes a hemispherical resonator, a force application electrode, and a pick-up electrode (detector), among which the hemispherical resonator serves as the core component. HRG research is still in the exploration stage and has a big gap with the advanced levels abroad. Particularly, key technologies and processes on manufacturing and mass leveling of the hemispherical resonator have become "throat-clutching" challenges for HRG products to break through the zero-bias stability of 0.01°/h. For the mass leveling of the resonator, there are mainly the laser machining, chemical corrosion, ion beam trimming, etc. The chemical corrosion method has the poor controllability and cannot meet the high-precision requirement, even though it can remove the fused quartz effectively. The laser machining will increase the damaged layer and thus affect the performance. As the atomic non-stress material removal method, the ion beam trimming method has received widespread attentions because of the high leveling precision and little influence on surface and deep structures of the material. However, it is difficult to implement the nanogram-level mass trimming by the existing ion beam polishing. There is an urgent need to improve the ion beam mass trimming ability and promote research and applications on the hemispherical resonator to a new level.

With regard to surface characteristic regulation and control of the optical components, presently, in an attempt to solve the problem that the acceleration of the machine tool cannot meet requirements of high-gradient error figuring, Liao Wenlin, et al. from the National University of Defense Technology push forward a solution in which the requirement on the acceleration of the machine tool is reduced by increasing an extra removal amount to implement the ion beam polishing on the high-gradient surface error. However, the increase of the extra removal amount will deteriorate the optical performance on the surfaces of the optical components. According to related research, the depth removal by ion sputtering directly affects the photothermal weak absorption on the surfaces of the optical components.

To sum up, to achieve the ideal mass leveling state, multi-band error convergence of the optical surface and regulation and control to the optical performance of the surface, it is desirable to provide a novel ion beam polishing method for the hemispherical resonator.

The existing continuous ion beam machining mode has the following defects: 1) The mode cannot figure the high-band error and cannot meet the production requirements of the optical components; 2) The dynamic characteristics of the machine tool cannot reach ideal conditions, and there are the error arising from the dwell time, the error residue or even the extra error being introduced; 3) The ion beams are extracted continuously during machining to sputter the whole surface for removal, which affects the convergence of the surface; 4) With the continuous scanning mode, the material in a region where the material does not need to be removed is removed, and the thickness of the damaged layer is increased; and 5) Due to uncontrollable beam diameters during the ion beam polishing, the full-band convergence of the surface error cannot be implemented during single machining. Due to the above defects, the ion beam machining system cannot effectively remove the high-gradient error in use, which does not facilitate the precision control over the removal amount; and during the machining, it is inevitable to remove an extra layer, and increase the depth of the damaged layer, thereby reducing the ion beam polishing efficiency and weakening the performance of the optical components. To achieve the ideal mass leveling state, multi-band error convergence of the optical surface and control over the optical performance of the surface, there are needs to provide a novel ion beam polishing method for the hemispherical resonator, and dynamically control the ion beam removal function. Therefore, to provide a method for controlling a dynamically controllable ultrawide-amplitude and high-response ion resource has become a critical technical problem to be solved urgently by a person skilled in the art.

SUMMARY

The technical problems to be solved by the present disclosure lie in that: in view of the above-mentioned problems, the present disclosure provides a method for controlling a dynamically controllable ultrawide-amplitude and high-response ion resource, which can control a removal function of the ion beam polishing in real time, improve the precision and efficiency of the ion beam polishing, and further reduce the requirement on a movement system of the machine tool and the depth of a damaged layer. The present disclosure can be applied to such fields as the high-precision figuring, mass trimming and surface characteristic control of optical components, and has the advantages of high precision and efficiency, wide adjustment range, better operability, significant economical practicability, promising application prospect, and so on.

To solve the above technical problems, the technical solutions adopted by the present disclosure are as follows:

A method for controlling a dynamically controllable ultra-wide-amplitude and high-response ion resource comprising:

establishing a removal function database;

acquiring an initial surface error of an optical component, matching a removal function according to the initial surface error and the removal function database, and resolving dwell time of ion beam machining based on the matched removal function;

selecting an optimal velocity V of a movable shaft of a machine tool according to the resolved result of the dwell time;

dynamically resolving process parameters of an ion source according to the initial surface error of the optical component and the velocity V of the movable shaft, and generating a corresponding numerical control (NC) program to machine the optical component; and determining whether a surface error of the machined optical component meets a requirement, ending and exiting the program if a result of determination is positive, or otherwise, repeating the acquiring step.

Optionally, the matching a removal function according to the initial surface error and the removal function database in the acquiring step may include: classifying, according to a wavelength of an initial surface error at each dwell point, the error into a low band, a medium band or a high band, and selecting, by changing beam diameters of different removal functions, a removal function within a corresponding cut-off frequency for different error types, wherein a corresponding frequency when an effective material-removal rate is less than or equal to a preset threshold is determined as a figuring cut-off frequency.

Optionally, when the dwell time of the ion beam machining is resolved in the acquiring step, a function expression for calculating the dwell time of the ion beam machining may be:

$$T = \frac{A_\lambda}{B}\left(\sin\left(\frac{2\pi x}{\lambda}\right)\exp\left(\frac{1}{18}\left(\frac{nd_{6\sigma}}{\lambda}\right)^2\right) + 1\right),$$

where T is dwell time of the ion beam machining at a mesh in a present state, $A_\lambda$ is an error amplitude, B is an area removal efficiency of the removal function along a scanning direction x, $\lambda$ is an error frequency, x is a position of the scanning direction, and $d_{6\sigma}$ is a beam diameter of the removal function; and a function expression for calculating the area removal efficiency B of the removal function along the scanning direction x may be:

$$B = \int_{-\infty}^{+\infty} R(x, 0)dx = \sqrt{2\pi}\,d_{6\sigma}A/6,$$

where R(x, 0) is a removal amount of an initial dwell point (x, 0), x is the position of the scanning position, the $d_{6\sigma}$ is the beam diameter of the removal function, and the A is a peak removal rate.

Optionally, the selecting step may include:

calculating a velocity distribution of the movable shaft of the machine tool at each dwell point according to the following formula:

$$v(x) = \left(\frac{A_\lambda}{B}\exp\left(\frac{1}{18}\left(\frac{nd_{6\sigma}}{\lambda}\right)^2\right)\left(\sin\left(\frac{2\pi x}{\lambda}\right) + 1\right) + \frac{A_a}{B}\right)^{-1},$$

where v(x) represents a velocity of the movable shaft at a feed amount x in the scanning direction, $A_\lambda$ is the error amplitude, B is the area removal efficiency of the removal function along the scanning direction x, $d_{6\sigma}$ is the beam diameter of the removal function, A is the error frequency, x is the position of the scanning position, and $A_a$ is a material removal layer corresponding to an equalized dwell time $A_a/B$; and selecting an operating velocity V of the machine tool that meets t=L/V, for t>T, where, L is a size into which the mesh of the component is subdivided, and T is the dwell time of the ion beam machining.

Optionally, the dynamically resolved process parameters of the ion source in the selecting step may include a pulse frequency, a duty ratio and an amplitude for a pulse voltage of the ion source, and the dynamically resolving process parameters of an ion source may include: selecting an operating velocity of the movable shaft of the machine tool according to the calculated dwell time and keeping the operating velocity unchanged, determining duty ratios of the pulse ion source at different meshes according to mesh dwell time, obtaining different amplitudes of a corresponding pulse voltage according to the corresponding removal function, and resolving a frequency distribution of the pulse voltage according to an error distribution between adjacent regions.

Optionally, a function expression for calculating the pulse frequency may be:

$$f = V/L$$

where f is the pulse frequency, V is the selected operating velocity of the machine tool, and L is the size into which the mesh of the component is subdivided.

Optionally, a function expression for calculating the duty ratio may be:

$$DR = T/t$$

where DR is the duty ratio, t=L/V is duration during which the movable shaft passes through the mesh during machining, and T is the dwell time of the ion beam machining at the mesh in the present state.

Optionally, dynamically resolving the amplitude may include: searching a preset removal function beam diameter and amplitude mapping table for the amplitude of the pulse voltage corresponding to the beam diameter of the present removal function.

In addition, the present disclosure further provides a system for controlling a dynamically controllable ultrawide-amplitude and high-response ion source, including a microprocessor and a memory that are connected to each other, where the microprocessor is programmed or configured to execute steps of the method for controlling a dynamically controllable ultrawide-amplitude and high-response ion source.

In addition, the present disclosure further provides a computer readable storage medium, where the computer readable storage medium stores a computer program that is programmed or configured to execute steps of the method for controlling a dynamically controllable ultrawide-amplitude and high-response ion source.

Compared with the known methods, the present disclosure has the following advantages: The method provided by the present disclosure includes the following steps in each cycle of iterative machining: acquiring an initial surface error of an optical component, matching a removal function according to the initial surface error and the removal function database, and calculating dwell time of ion beam machining based on the matched removal function; selecting an optimal velocity V of a movable shaft of a machine tool according to a calculation result of the dwell time; and dynamically calculating process parameters of an ion source according to the initial surface error of the optical component and the velocity V of the movable shaft, and generating a corresponding NC program to machine the optical component. The method can control the removal function of the ion beam polishing in real time, improve the precision and efficiency of the ion beam polishing, and further reduce the requirement on a movement system of the machine tool and the depth of a damaged layer. The present disclosure can be applied to such fields as the high-precision figuring, mass trimming and surface characteristic control of optical components, and has the advantages of high precision and efficiency, wide adjustment range, better operability, significant economical practicability, promising application prospect and so on.

BRIEF DESCRIPTION OF THE DRAWINGS

FIG. 2 shows a schematic diagram for extracting removal functions of different beam diameters with different amplitudes of voltages in accordance with an embodiment of the present disclosure;

FIGS. 3(a) and 3(b) show implementation process diagrams of dwell time of existing ion beam machining in accordance with embodiments of the present disclosure;

FIG. 4 shows a schematic diagram of existing ion beam machining for removing a local error distribution in accordance with an embodiment of the present disclosure;

FIG. 9 shows a diagram of a figuring result in accordance with an embodiment of the present disclosure.

DETAILED DESCRIPTION OF THE EMBODIMENTS

With a sample having a size of Φ100*5 mm as an example, the method and system for controlling a dynamically controllable ultrawide-amplitude and high-response ion source provided by the present disclosure will be further described below in detail.

Figure 1:
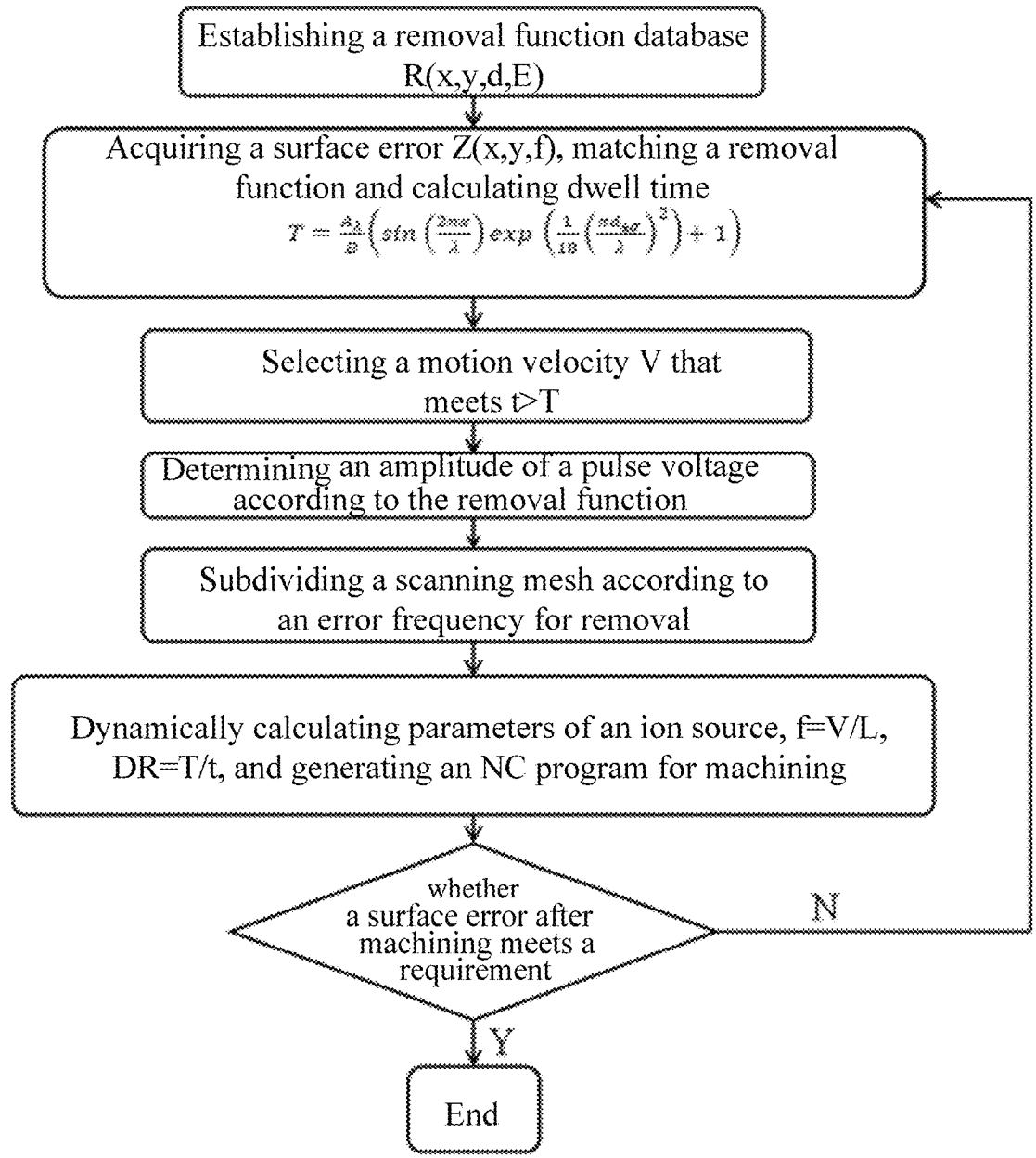
FIG. 1 shows a basic flow chart of a method in accordance with an embodiment of the present disclosure.

As shown in FIG. 1, the method for controlling a dynamically controllable ultrawide-amplitude and high-response ion source provided by the embodiment may include the following steps:

1) Establishing a removal function database;

2) Acquiring an initial surface error of an optical component, matching a removal function according to the initial surface error and the removal function database, and resolving dwell time of ion beam machining based on the matched removal function;

3) Selecting an optimal velocity V of a movable shaft of a machine tool according to a calculation result of the dwell time;

4) Dynamically resolving process parameters of an ion source according to the initial surface error of the optical component and the velocity V of the movable shaft and generating a corresponding numerical control (NC) program to machine the optical component; and 5) Determining whether a surface error of the machined optical component meets a requirement, end and exit the program if a result of determination is positive, or otherwise, repeat the Acquiring Step 2.

The removal function database established in Step 1) provides different removal function models R (x,y,d,E) for acquiring different surface errors, which offers the convenience of matching the removal function according to the initial surface error and the removal function database in Step 2). FIGS. 7(a)-7(f) illustrate a model R(x,y,d,E) for extracting a removal function according to Step 1) in the embodiment, where, (x,y) is the coordinate of the dwell point, d represents the beam diameter of the removal function, and E represents energy of the pulse voltage.

Figure 8:
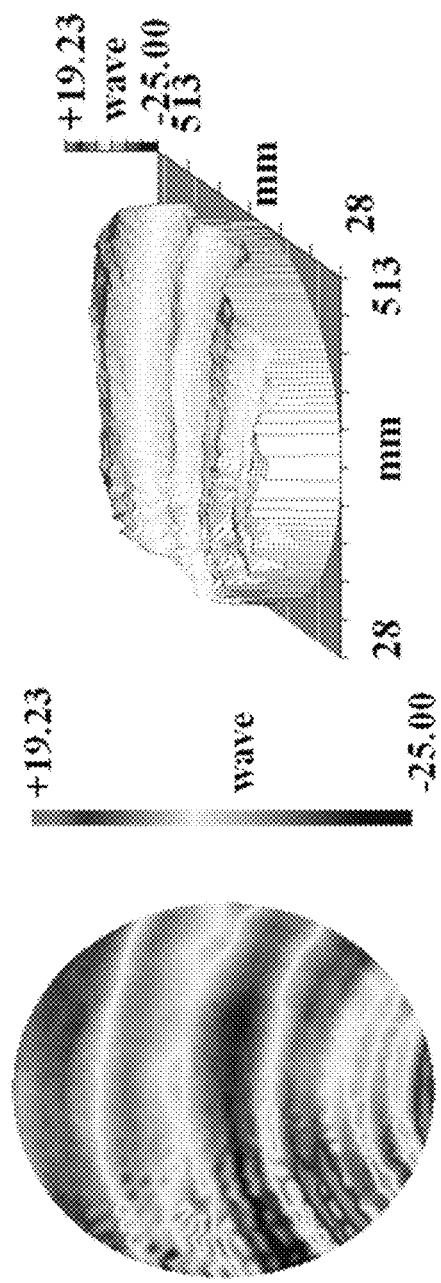
FIG. 8 shows a diagram of an initial surface error in accordance with an embodiment of the present disclosure.

Acquiring the initial surface error of the optical component in Step 2) refers to measuring the optical component and extracting the initial surface error Z(x,y,f). FIG. 8 illustrates a case where the surface of the sample to be machined is measured according to Step 2) in the embodiment to obtain the surface error distribution. Matching the removal function according to the initial surface error and the removal function database in Step 2) includes: classifying, according to a wavelength of an initial surface error at each dwell point, the error into a low band, a medium band or a high band, and selecting, by changing beam diameters of different removal functions, a removal function within a corresponding cut-off frequency for different error types, where a corresponding frequency when an effective material-removal rate is less than or equal to a preset threshold (for example, the preset threshold is 0.1 in the embodiment) is determined as a figuring cut-off frequency.

In the embodiment, the rule for classifying the error into the low band, the medium band or the high band is as follows: low band in case of wavelength λ<33 mm, the medium band in case of 0.12 mm<wavelength λ<33 mm, and the high band in case of wavelength λ<0.12 mm.

In the embodiment, the effective material-removal rate is denoted as $\eta(d,\lambda)$, with a function expression for calculation being:

$$\eta(d, \lambda) = e^{-\frac{\pi^2}{18}\left(\frac{d}{\lambda}\right)^2},$$

where d represents the beam diameter of the removal function, and λ represents the wavelength.

In the embodiment, a function expression for calculating the figuring cut-off frequency is:

$$\frac{1}{\lambda} = f_c = \frac{3\sqrt{2\ln 10}}{\pi d_{6\sigma}}$$

where $d_{6\sigma}$ is the beam diameter of the removal function. In the embodiment, the removal functions within the corresponding cut-off frequencies need to be changed for errors in different bands, for example, by changing the beam diameters $d_{6\sigma}$ of different removal functions.

In the embodiment, when the dwell time of the ion beam machining is resolved in Step 2), a function expression for calculating the dwell time of the ion beam machining is:

$$T = \frac{A_\lambda}{B}\left(\sin\left(\frac{2\pi x}{\lambda}\right)\exp\left(\frac{1}{18}\left(\frac{\pi d_{6\sigma}}{\lambda}\right)^2\right) + 1\right),$$

where T is dwell time of the ion beam machining at a mesh in a present state, $A_\lambda$ is an amplitude of error, B is an area removal efficiency of the removal function along a scanning direction x, $\lambda$ is a frequency of error, x is a position of the scanning direction, and $d_{6\sigma}$ is a beam diameter of the removal function; and a function expression for calculating the area removal efficiency B of the removal function along the scanning direction x is:

$$B = \int_{-\infty}^{+\infty} R(x, 0)dx = \sqrt{2\pi}\, d_{6\sigma} A/6,$$

where R(x, 0) is a removal amount of an initial dwell point (x, 0), x is the position of the scanning position, the $d_{6\sigma}$ is the beam diameter of the removal function, and the A is a peak removal rate.

Figure 5:
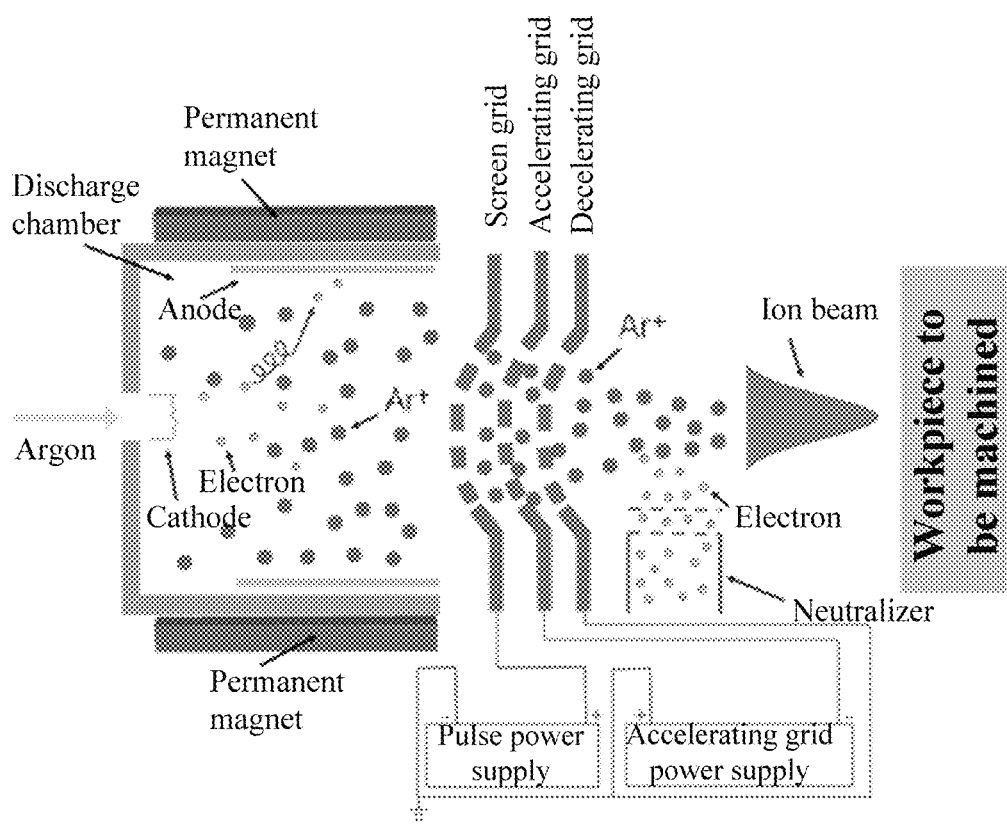
FIG. 5 shows a schematic diagram for implementing an ultrawide-amplitude and high-response ion source with a pulse in accordance with an embodiment of the present disclosure.

FIGS. 3(a) and 3(b) show implementation process diagrams of dwell time of existing ion beam machining in the embodiment. In the embodiment, each mesh has a size of 1 mm, and there is one dwell point every 1 mm along the polishing path (y direction); and thus, the dwell time may be calculated according to the surface error at each dwell point and the removal function. FIG. 3(a) shows a scanning path during the ion beam machining, and FIG. 3(b) shows a velocity curve during the ion beam machining. FIG. 4 is a schematic diagram of existing ion beam machining for removing a local error distribution in an embodiment of the present disclosure. Referring to FIG. 4, the protruding part is the error needing to be removed. The existing ion beam machining will remove the material in the region on the surface of the component where the error does not need to be removed, and such a mode increases the extra removed layer and damages the surface performance of the component. FIG. 5 is a schematic diagram for implementing an ultrawide-amplitude and high-response ion source with a pulse in an embodiment of the present disclosure. Referring to FIG. 5, the beam-guiding voltage of the ion optical system is replaced with a pulse voltage; and the amplitude, duty ratio and frequency of the beam-guiding voltage may be controlled in real time, thereby controlling the beam diameter of the removal function as well as the duty ratio and frequency for extracting the ion beam.

In the embodiment, Step 3) includes:
3.1) calculating a velocity distribution of the movable shaft of the machine tool at each dwell point according to the following formula:

$$v(x) = \left(\frac{A_\lambda}{B}\exp\left(\frac{1}{18}\left(\frac{\pi d_{6\sigma}}{\lambda}\right)^2\right)\left(\sin\left(\frac{2\pi x}{\lambda}\right) + 1\right) + \frac{A_a}{B}\right)^{-1},$$

where v(x) represents a velocity of the movable shaft at a feed amount x in the scanning direction, $A_\lambda$ is the error amplitude, B is the area removal efficiency of the removal function along the scanning direction x, $d_{6\sigma}$ is the beam diameter of the removal function, A is the error frequency, x is the position of the scanning position, and $A_a$ is a material removal layer corresponding to an equalized dwell time $A_a/B$; and 3.2) selecting an operating velocity V of the machine tool that meets t=L/V, for t>T, where, L is the size into which the mesh of the component is subdivided, and T is the dwell time of the ion beam machining.

In the embodiment, the dynamically resolved process parameters of the ion source in Step 3) include a pulse frequency, a duty ratio and an amplitude for a pulse voltage of the ion source, and dynamically resolving the process parameters of the ion source include: selecting an operating velocity of the movable shaft of the machine tool according to the calculated dwell time and keeping the operating velocity unchanged, determining duty ratios of the pulse ion source at different meshes according to mesh dwell time, obtaining different amplitudes of a corresponding pulse voltage according to the corresponding removal function, and resolving a frequency distribution of the pulse voltage according to an error distribution between adjacent regions.

In the embodiment, a function expression for calculating the pulse frequency is:

$f=V/L$ where, f is the pulse frequency, V is the selected operating velocity of the machine tool, and L is the size into which the mesh of the component is subdivided.

In the embodiment, a function expression for calculating the duty ratio is:

$DR=T/t$ where, DR is the duty ratio, t=L/V is the duration during which the movable shaft passes through the mesh during machining, and T is the dwell time of the continuous ion beam machining at the mesh in the present state.

Figure 6:
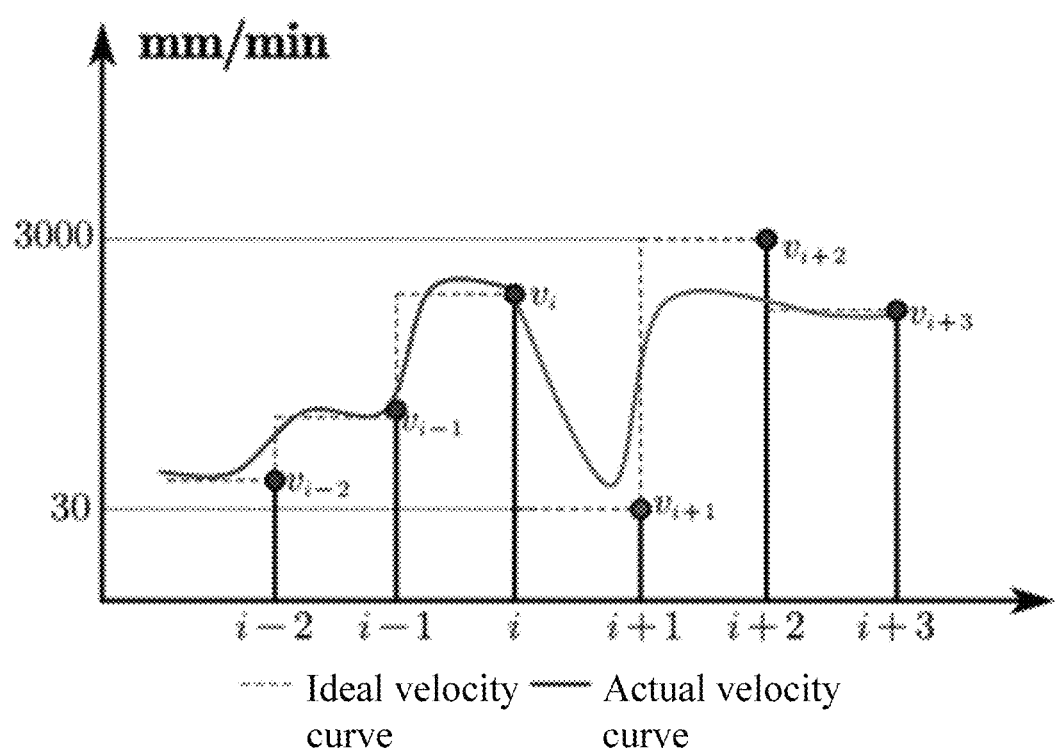
FIG. 6 shows a velocity distribution diagram of a dwell point in accordance with an embodiment of the present disclosure.
Figure 7A:
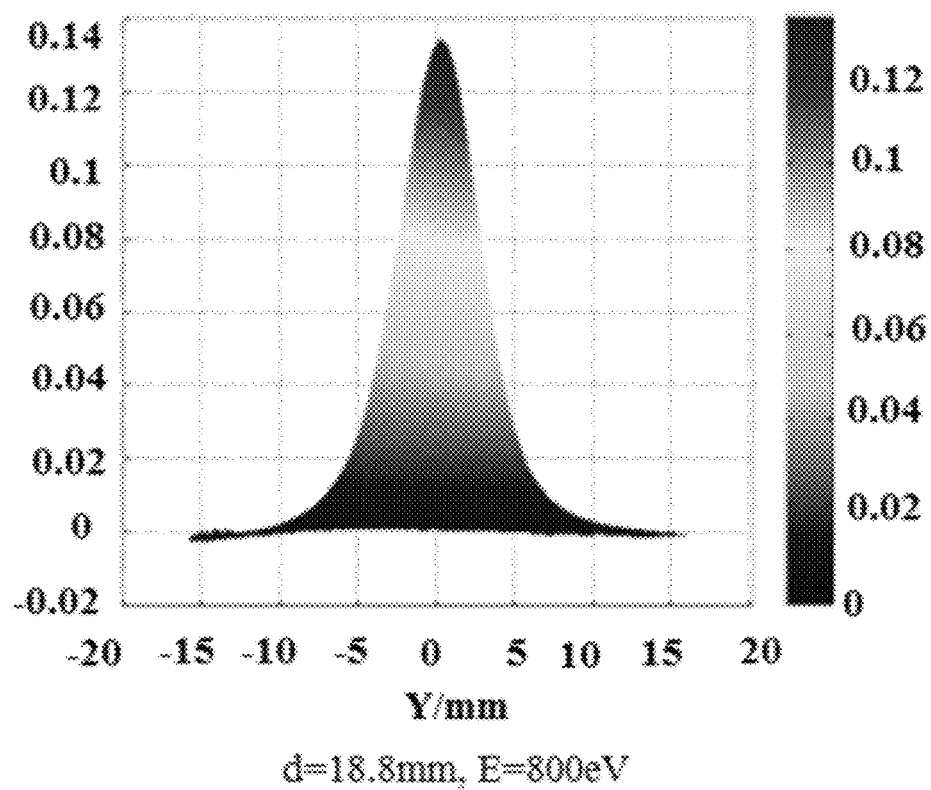
FIGS. 7(a)-7(f) show schematic diagrams for extracting a removal function in accordance with embodiments of the present disclosure.
Figure 7B:
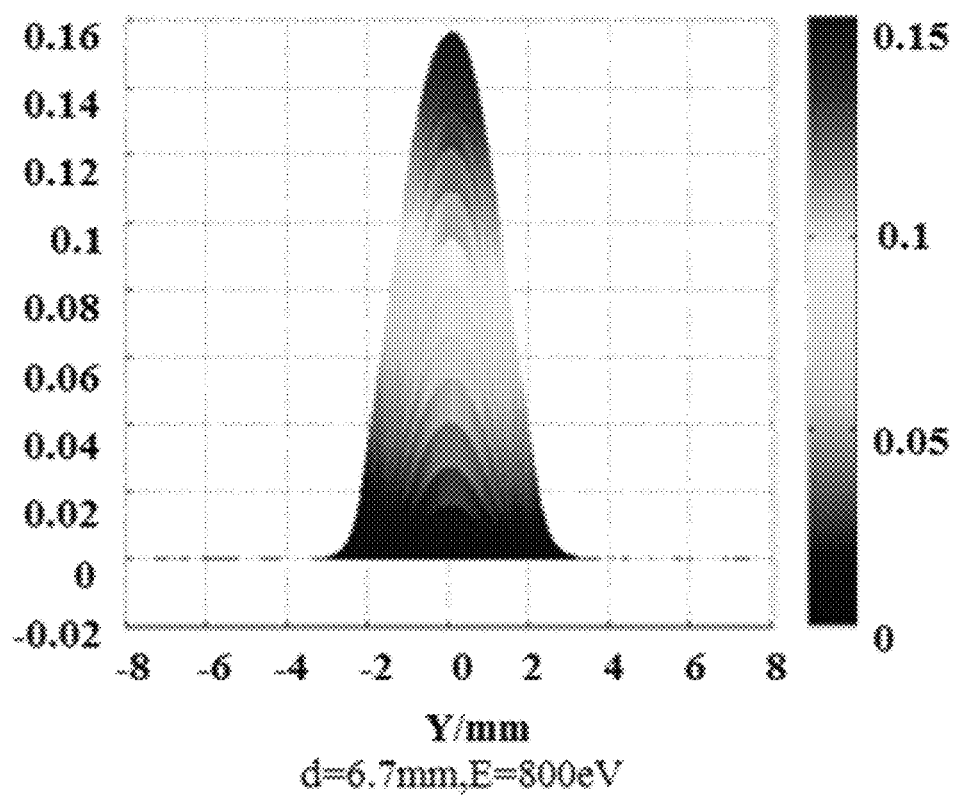
Figure 7C:
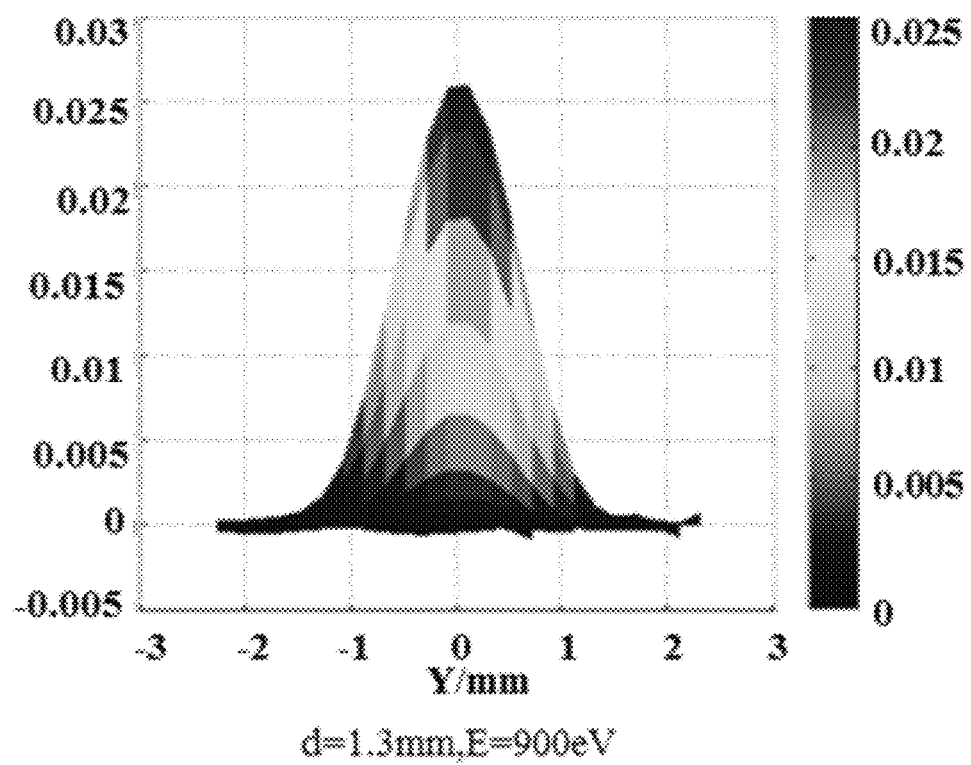
Figure 7D:
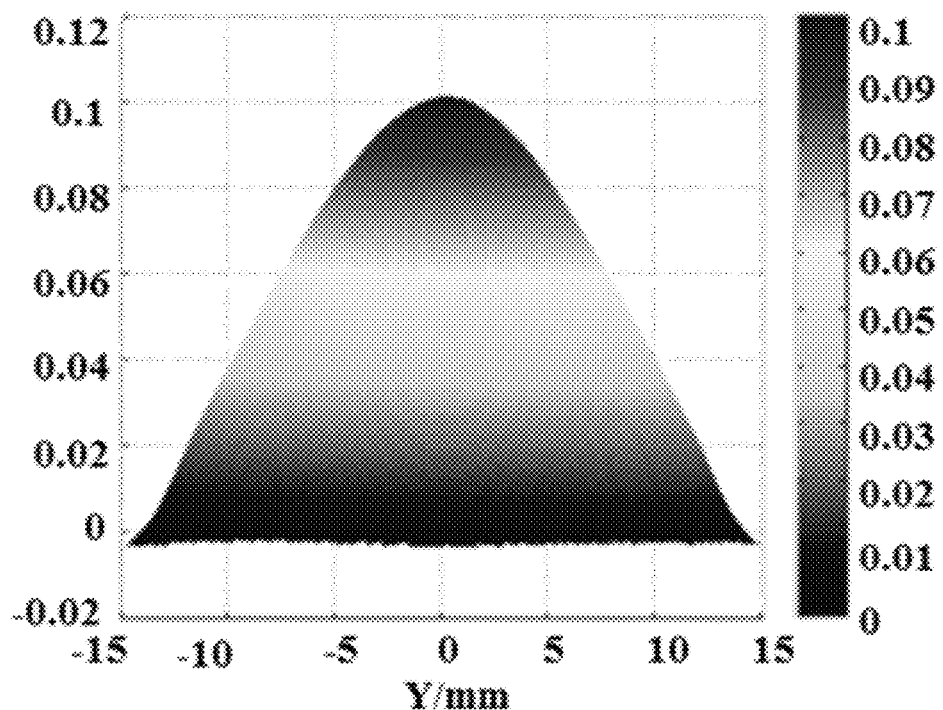
Figure 7E:
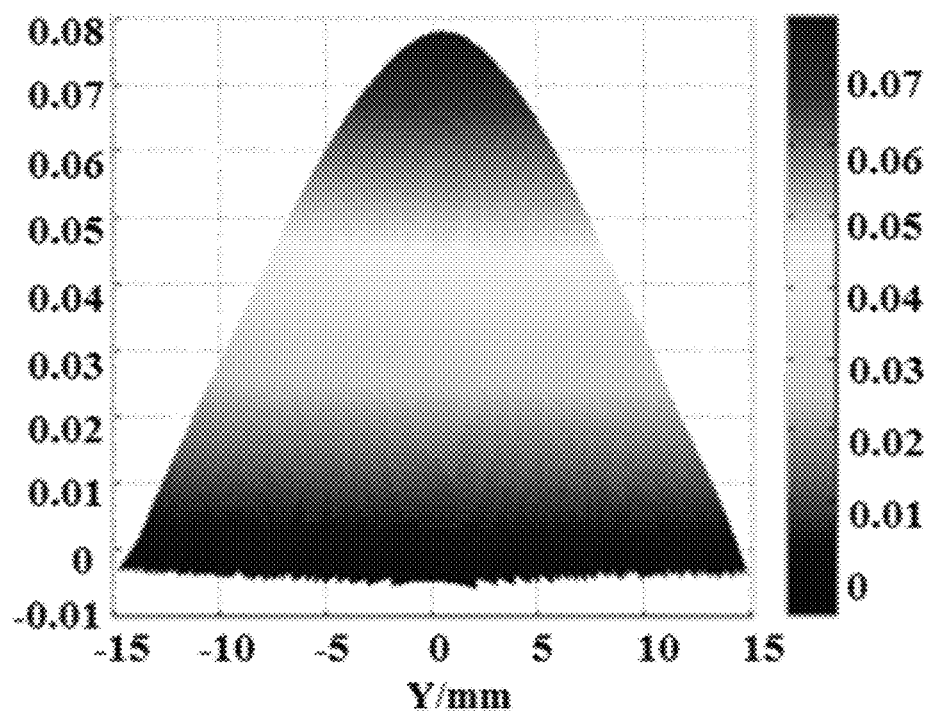
Figure 7F:
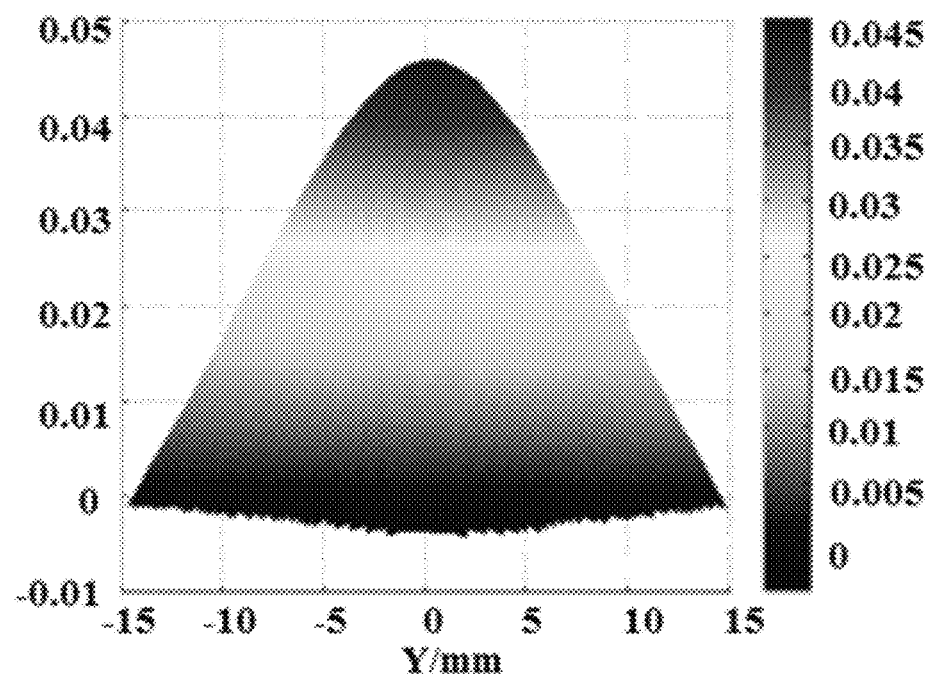

As shown in FIG. 6, when the machine tool moves from the dwell point i+1 to the dwell point i+2, the dwell time $t_1$ required for removing the material traditionally by changing the acceleration of the movable shaft may be obtained from Formula (1):

$$T = \frac{V_{i+1}V_i}{a} = 39.6032 \text{ ms}$$

where $V_{i+1}$ is an instantaneous velocity of the movable shaft at the dwell point i+1, and $V_i$ is an instantaneous velocity of the movable shaft at the dwell point i.

With the addition of the pulse, the duration $t_2$ during which the machine tool passes through the mesh is:

$$t = \frac{L}{V} = 60 \text{ ms}$$

where L is a width of the mesh, and V is a velocity of the movable shaft of the machine tool.

The duty ratio D of the pulse is adjusted as:

$$D = \frac{T}{t} = 66\%$$

Therefore, corresponding dwell time can be obtained without changing the velocity of the machine tool in real time, thereby reducing the requirement on the dynamic performance of the machine tool. Due to motion characteristics of the existing machine tool, the effective removal rate of the ion beam polishing for the errors in the medium and high bands is greatly reduced. These errors can only be eliminated by a variety of hybrid processes. With the introduction of the dynamically controllable ultrawide-amplitude and high-response ion source, error frequency may be in one-to-one correspondence with the pulse frequency by measuring and obtaining frequency components of the surface error; and thus, the dynamically controllable ultrawide-amplitude and high-response ion source generates the pulse ion beam to eliminate the errors in the medium and high bands. Where the dwell time of each mesh is determined, the duty ratio of the corresponding mesh is obtained; and according to the band in which the error is distributed, the corresponding pulse frequency may be matched.

In the embodiment, dynamically resolving the amplitude includes: searching a preset removal function beam diameter and amplitude mapping table for the amplitude of the pulse voltage corresponding to the beam diameter of the present removal function. The preset removal function beam diameter and amplitude mapping table may be calibrated in advance through the test. The removal functions of different beam diameters can remove the errors with the corresponding frequency range; and the removal function of the small beam diameter may effectively remove the high-frequency error. The existing direct-current (DC) ion source machining has a single mode and can only select the removal function having one beam diameter at a time. As the removal function of the small beam diameter has the low removal efficiency, the removal function of the large beam diameter is typically used first for figuring; and when the convergence rate of the surface is reduced to a certain value, the removal function of the smaller beam diameter is used for figuring. When there are more high-band surface errors, excessive time will be wasted to change the beam diameter of the removal function, which greatly reduces the machining efficiency. The dynamically controllable ultrawide-amplitude and high-response ion source can acquire the removal functions of different beam diameters through the voltage amplitude or by changing the aperture of the high-frequency shutter, as shown in FIG. 2. In this way, the time for acquiring the removal functions of different beam diameters by changing the grid is greatly saved, and the figuring efficiency is greatly improved.

Generating the corresponding NC program to machine the optical component in Step 4) includes: 4.1) clamping a workpiece to an ion beam machine tool as specified; 4.2) controlling various parameters of a pulse ion source with the program; 4.3) upon the various parameters of the pulse ion source changing, an ion beam removal function also changing correspondingly; and 4.4) controlling a beam diameter, a removal efficiency, a beam-guiding occasion and so on of the ion beam removal function in real time for the ion beam polishing, by controlling the parameter change of the pulse ion source with the program. Optionally, in Steps 4.2) and 4.3), the beam diameter of the removal function and the removal efficiency are changed by removing the error of the corresponding band and changing the parameter of the pulse voltage, which greatly saves the preparation time for machining and improves the machining efficiency unlike the conventional ion beam machining that changes the ion beam diameter by changing the diaphragm. Moreover, the ion beam machining occasion is effectively controlled by controlling the duty ratio and frequency of the pulse voltage and the machined region is not additionally removed, such that the depth of the damaged layer is reduced, and the performance of the optical component is greatly improved. Through the machining, each band error of the component is effectively removed, as shown in FIG. 9. The machining efficiency is greatly improved when compared to the conventional machining. As such, the feasibility of the embodiment is verified.

To sum up, the embodiment changes pursuits of the conventional ion beam polishing for long-time stability and uniform beam current of the ion source and meets different application requirements by changing the movement system of the machine tool. The provided method for controlling a dynamically controllable ultrawide-amplitude and high-response ion source can dynamically adjust the process parameters of the ion source by mechanical modulation methods such as mounting the shutter or the baffle plate and by controlling the beam-guiding time with the pulse modulation voltage. The embodiment has the advantages of adjusting the removal efficiency of the removal function in real time, changing the beam current density of the ion beam polishing and the depth of the damaged layer of the ion beam polishing, and so on, changes the thinking pattern of the conventional ion beam polishing, and provides the brand-new machining concept. The method in the embodiment greatly improves the machining efficiency while meeting the machining precision, reduces the requirement on the dynamic performance of the machine tool, saves the raw materials, reduces the depth of the damaged layer of the optical component, improves the performance of the optical component, and reduces the production cost. The embodiment brings about the advantages of high precision and efficiency, better operability, significant economical practicability, simple process and so on, and can effectively take both the precision and the efficiency into considerations in the ion beam polishing. Experiments reveal that the present disclosure possesses the feasibility and the very high practical value.

In addition, the embodiments further provide a system for controlling a dynamically controllable ultrawide-amplitude and high-response ion source, including a microprocessor and a memory that are connected to each other, where the microprocessor is programmed or configured to execute steps of the method for controlling a dynamically controllable ultrawide-amplitude and high-response ion source.

In addition, the embodiment further provides a computer readable storage medium, where the computer readable storage medium stores a computer program that is programmed or configured to execute steps of the method for controlling a dynamically controllable ultrawide-amplitude and high-response ion source.

Those skilled in the art shall understand that the embodiments of the present disclosure may be implemented as a method, a system, or a computer program product. Therefore, the present disclosure may be embodied in a form of hardware only embodiments, software only embodiments, or embodiments with a combination of software and hardware. Moreover, the present disclosure may be embodied in a form of a computer program product that is implemented on one or more computer-usable storage media (including but not limited to a disk memory, a CD-ROM, an optical memory, and the like) that include computer-usable program codes. The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specified function in one or more processes in the flowcharts and/or in one or more blocks in the block diagrams. These computer program instructions may also be stored in a computer readable memory that can direct the computer or any other programmable data processing device to work in a specific manner, so that the instructions stored in the computer readable memory generate an article of manufacture that includes an instruction apparatus. The instruction apparatus implements a specified function in one or more processes in the flowcharts and/or in one or more blocks in the block diagrams. These computer program instructions may also be loaded into a computer or another programmable data processing device, so a series of operations and steps are performed on the computer or the another programmable device, thereby generating computer-implemented processing. Therefore, the instructions executed on the computer or another programmable device provide steps for implementing a specified function in one or more processes in the flowcharts and/or in one or more blocks in the block diagrams.

The foregoing descriptions are only embodiments or implementations of the present disclosure, and the scope of the present disclosure is not limited to the foregoing embodiments. All technical solutions based on the idea of the present disclosure fall within the protection scope of the present disclosure. It should be pointed out that for a person of ordinary skilled in the art, several improvements and modifications may be made without departing from the principle of the present disclosure, and such improvements and modifications shall also be construed to fall within the protection scope of the present disclosure.

What is claimed is:

1. A method for controlling a dynamically controllable ultrawide-amplitude and high-response ion source, comprising:
    1) Establishing a removal function database;
    2) Acquiring an initial surface error of an optical component, matching a removal function according to the initial surface error and the removal function database, and resolving dwell time of ion beam machining based on the matched removal function;
    3) Selecting an optimal velocity V of a movable shaft of a machine tool according to the resolved result of the dwell time;
    4) Dynamically resolving process parameters of an ion source according to the initial surface error of the optical component and the velocity V of the movable shaft, and generating a corresponding numerical control (NC) program to machine the optical component; and
    5) Determining whether a surface error of the machined optical component meets a requirement, ending and exiting the program if a result of determination is positive, or otherwise, repeating step 2).

2. The method for controlling a dynamically controllable ultrawide-amplitude and high-response ion source according to claim 1, wherein the matching a removal function according to the initial surface error and the removal function database in step 2) comprises: classifying, according to a wavelength of an initial surface error at each dwell point, the error into a low band, a medium band or a high band, and selecting, by changing beam diameters of different removal functions, a removal function within a corresponding cut-off frequency for different error types, wherein a corresponding frequency when an effective material-removal rate is less than or equal to a preset threshold is determined as a figuring cut-off frequency.

3. The method for controlling a dynamically controllable ultrawide-amplitude and high-response ion source according to claim 1, wherein when the dwell time of the ion beam machining is resolved in step 2), a function expression for calculating the dwell time of the ion beam machining is:

$$T = \frac{A_\lambda}{B}\left(\sin\left(\frac{2\pi x}{\lambda}\right)\exp\left(\frac{1}{18}\left(\frac{\pi d_{6\sigma}}{\lambda}\right)^2\right) + 1\right),$$

where T is dwell time of the ion beam machining at a mesh in a present state, $A_\lambda$ is an error amplitude, B is an area removal efficiency of the removal function along a scanning direction x, $\lambda$ is an error frequency, x is a position of the scanning direction, and $d_{6\sigma}$ is a beam diameter of the removal function; and a function expression for calculating the area removal efficiency B of the removal function along the scanning direction x is:

$$B = \int_{-\infty}^{+\infty} R(x, 0)dx = \sqrt{2\pi}\, d_{6\sigma} A / 6,$$

where R(x, 0) is a removal amount of an initial dwell point (x, 0), x is a position of the scanning position, the $d_{6\sigma}$ is the beam diameter of the removal function, and the A is a peak removal rate.

4. The method for controlling a dynamically controllable ultrawide-amplitude and high-response ion source according to claim 1, wherein step 3) comprises:
    3.1) calculating a velocity distribution of the movable shaft of the machine tool at each dwell point according to the following formula:

$$v(x) = \left(\frac{A_\lambda}{B}\exp\left(\frac{1}{18}\left(\frac{\pi d_{6\sigma}}{\lambda}\right)^2\right)\left(\sin\left(\frac{2\pi x}{\lambda}\right) + 1\right) + \frac{A_a}{B}\right)^{-1},$$

where v(x) represents a velocity of the movable shaft at a feed amount x in the scanning direction, $A_\lambda$ is the error amplitude, B is the area removal efficiency of the removal function along the scanning direction x, $d_{6\sigma}$ is the beam diameter of the removal function, $\lambda$ is the error frequency, x is the position of the scanning position, and $A_a$ is a material removal layer corresponding to an equalized dwell time $A_a/B$; and 3.2) selecting an operating velocity V of the machine tool that meets $t=L/V$, for $t>T$, wherein, L is a size into which the mesh of the component is subdivided, and T is the dwell time of the ion beam machining.

5. The method for controlling a dynamically controllable ultrawide-amplitude and high-response ion source according to claim 1, wherein the dynamically resolved process parameters of the ion source in step 3) comprise a pulse frequency, a duty ratio and an amplitude for a pulse voltage of the ion source, and the dynamically resolving process parameters of an ion source comprises: selecting an operating velocity of the movable shaft of the machine tool according to the calculated dwell time and keeping the operating velocity unchanged, determining duty ratios of the pulse ion source at different meshes according to mesh dwell time, obtaining different amplitudes of a corresponding pulse voltage according to the corresponding removal function, and resolving a frequency distribution of the pulse voltage according to an error distribution between adjacent regions.

6. The method for controlling a dynamically controllable ultrawide-amplitude and high-response ion source according to claim 5, wherein a function expression for calculating the pulse frequency is:

$$f=V/L$$

where f is the pulse frequency, V is the selected operating velocity of the machine tool, and L is the size into which the mesh of the component is subdivided.

7. The method for controlling a dynamically controllable ultrawide-amplitude and high-response ion source according to claim 5, wherein a function expression for calculating the duty ratio is:

$$DR=T/t$$

where DR is the duty ratio, $t=L/V$ is a duration during which the movable shaft passes through the mesh during machining, and T is the dwell time of the ion beam machining at the mesh in the present state.

8. The method for controlling a dynamically controllable ultrawide-amplitude and high-response ion source according to claim 5, wherein dynamically resolving the amplitude comprises: searching a preset removal function beam diameter and amplitude mapping table for the amplitude of the pulse voltage corresponding to the beam diameter of the present removal function.

9. A system for controlling a dynamically controllable ultrawide-amplitude and high-response ion source, comprising a microprocessor and a memory that are connected to each other, wherein the microprocessor is programmed or configured to execute steps of the method for controlling a dynamically controllable ultrawide-amplitude and high-response ion source according to claim 1, wherein the method comprises:

1) Establishing a removal function database;
2) Acquiring an initial surface error of an optical component, matching a removal function according to the initial surface error and the removal function database, and resolving dwell time of ion beam machining based on the matched removal function;
3) Selecting an optimal velocity V of a movable shaft of a machine tool according to the resolved result of the dwell time;
4) Dynamically resolving process parameters of an ion source according to the initial surface error of the optical component and the velocity V of the movable shaft, and generating a corresponding numerical control (NC) program to machine the optical component; and
5) Determining whether a surface error of the machined optical component meets a requirement, ending and exiting the program if a result of determination is positive, or otherwise, jumping to step 2).

10. The system for controlling a dynamically controllable ultrawide-amplitude and high-response ion source according to claim 9, wherein the matching a removal function according to the initial surface error and the removal function database in step 2) comprises: classifying, according to a wavelength of an initial surface error at each dwell point, the error into a low band, a medium band or a high band, and selecting, by changing beam diameters of different removal functions, a removal function within a corresponding cut-off frequency for different error types, wherein a corresponding frequency when an effective material-removal rate is less than or equal to a preset threshold is determined as a figuring cut-off frequency.

11. The system for controlling a dynamically controllable ultrawide-amplitude and high-response ion source according to claim 9, wherein when the dwell time of the ion beam machining is resolved in step 2), a function expression for calculating the dwell time of the ion beam machining is:

$$T = \frac{A_\lambda}{B}\left(\sin\left(\frac{2\pi x}{\lambda}\right)\exp\left(\frac{1}{18}\left(\frac{\pi d_{6\sigma}}{\lambda}\right)^2\right) + 1\right),$$

where T is dwell time of the ion beam machining at a mesh in a present state, $A_\lambda$ is an error amplitude, B is an area removal efficiency of the removal function along a scanning direction x, $\lambda$ s an error frequency, x is a position of the scanning direction, and $d_{6\sigma}$ is a beam diameter of the removal function; and a function expression for calculating the area removal efficiency B of the removal function along the scanning direction x is:

$$B = \int_{-\infty}^{+\infty} R(x,0)dx = \sqrt{2\pi}\, d_{6\sigma} A/6,$$

where R(x, 0) is a removal amount of an initial dwell point (x, 0), x is a position of the scanning position, the $d_{6\sigma}$ is the beam diameter of the removal function, and the A is a peak removal rate.

12. The system for controlling a dynamically controllable ultrawide-amplitude and high-response ion source according to claim 9, wherein step 3) comprises:

3.1) calculating a velocity distribution of the movable shaft of the machine tool at each dwell point according to the following formula:

$$v(x) = \left(\frac{A_\lambda}{B}\exp\left(\frac{1}{18}\left(\frac{\pi d_{6\sigma}}{\lambda}\right)^2\right)\left(\sin\left(\frac{2\pi x}{\lambda}\right)+1\right)+\frac{A_a}{B}\right)^{-1},$$

Where v(x) represents a velocity of the movable shaft at a feed amount x in the scanning direction, $A_\lambda$ is the error amplitude, B is the area removal efficiency of the removal function along the scanning direction x, $d_{6\sigma}$ is the beam diameter of the removal function, $\lambda$ is the error frequency, x is the position of the scanning position, and $A_a$ is a material removal layer corresponding to an equalized dwell time $A_a/B$; and 3.2) selecting an operating velocity V of the machine tool that meets t=L/V, for t>T, wherein, L is a size into which the mesh of the component is subdivided, and T is the dwell time of the ion beam machining.

13. The system for controlling a dynamically controllable ultrawide-amplitude and high-response ion source according to claim 9, wherein the dynamically resolved process parameters of the ion source in step 3) comprise a pulse frequency, a duty ratio and an amplitude for a pulse voltage of the ion source, and the dynamically resolving process parameters of an ion source comprises: selecting an operating velocity of the movable shaft of the machine tool according to the calculated dwell time and keeping the operating velocity unchanged, determining duty ratios of the pulse ion source at different meshes according to mesh dwell time, obtaining different amplitudes of a corresponding pulse voltage according to the corresponding removal function, and resolving a frequency distribution of the pulse voltage according to an error distribution between adjacent regions.

14. The system for controlling a dynamically controllable ultrawide-amplitude and high-response ion source according to claim 13, wherein a function expression for calculating the pulse frequency is:

$$f=V/L$$

where f is the pulse frequency, V is the selected operating velocity of the machine tool, and L is the size into which the mesh of the component is subdivided.

15. The system for controlling a dynamically controllable ultrawide-amplitude and high-response ion source according to claim 13, wherein a function expression for calculating the duty ratio is:

$$DR=T/t$$

where DR is the duty ratio, t=L/V is a duration during which the movable shaft passes through the mesh during machining, and T is the dwell time of the ion beam machining at the mesh in the present state.

16. The system for controlling a dynamically controllable ultrawide-amplitude and high-response ion source according to claim 13, wherein dynamically resolving the amplitude comprises: searching a preset removal function beam diameter and amplitude mapping table for the amplitude of the pulse voltage corresponding to the beam diameter of the present removal function.

17. A computer readable storage medium, wherein the computer readable storage medium stores a computer program that is programmed or configured to execute steps of the method for controlling a dynamically controllable ultrawide-amplitude and high-response ion source according to claim 1, wherein the method comprises:

1) Establishing a removal function database;
2) Acquiring an initial surface error of an optical component, matching a removal function according to the initial surface error and the removal function database, and resolving dwell time of ion beam machining based on the matched removal function;
3) Selecting an optimal velocity V of a movable shaft of a machine tool according to the resolved result of the dwell time;
4) Dynamically resolving process parameters of an ion source according to the initial surface error of the optical component and the velocity V of the movable shaft, and generating a corresponding numerical control (NC) program to machine the optical component; and
5) Determining whether a surface error of the machined optical component meets a requirement, ending and exiting the program if a result of determination is positive, or otherwise, jumping to step 2).

18. The computer readable storage medium according to claim 17, wherein the matching a removal function according to the initial surface error and the removal function database in step 2) comprises: classifying, according to a wavelength of an initial surface error at each dwell point, the error into a low band, a medium band or a high band, and selecting, by changing beam diameters of different removal functions, a removal function within a corresponding cut-off frequency for different error types, wherein a corresponding frequency when an effective material-removal rate is less than or equal to a preset threshold is determined as a figuring cut-off frequency.

19. The computer readable storage medium according to claim 17, wherein when the dwell time of the ion beam machining is resolved in step 2), a function expression for calculating the dwell time of the ion beam machining is:

$$T = \frac{A_\lambda}{B}\left(\sin\left(\frac{2\pi x}{\lambda}\right)\exp\left(\frac{1}{18}\left(\frac{\pi d_{6\sigma}}{\lambda}\right)^2\right)+1\right),$$

where T is dwell time of the ion beam machining at a mesh in a present state, $A_\lambda$ is an error amplitude, B is an area removal efficiency of the removal function along a scanning direction x, $\lambda$ is an error frequency, x is a position of the scanning direction, and $d_{6\sigma}$ is a beam diameter of the removal function; and a function expression for calculating the area removal efficiency B of the removal function along the scanning direction x is:

$$B = \int_{-\infty}^{+\infty} R(x, 0)dx = \sqrt{2\pi}\,d_{6\sigma}A/6,$$

where R(x, 0) is a removal amount of an initial dwell point (x, 0), x is a position of the scanning position, the $d_{6\sigma}$ is the beam diameter of the removal function, and the A is a peak removal rate.

20. The computer readable storage medium according to claim 17, wherein step 3) comprises:

3.1) calculating a velocity distribution of the movable shaft of the machine tool at each dwell point according to the following formula:

$$v(x) = \left(\frac{A_\lambda}{B}\exp\left(\frac{1}{18}\left(\frac{\pi d_{6\sigma}}{\lambda}\right)^2\right)\left(\sin\left(\frac{2\pi x}{\lambda}\right)+1\right)+\frac{A_a}{B}\right)^{-1},$$

where v(x) represents a velocity of the movable shaft at a feed amount x in the scanning direction, $A_\lambda$ is the error amplitude, B is the area removal efficiency of the removal function along the scanning direction x, $d_{6\sigma}$ is the beam diameter of the removal function, $\lambda$ is the error frequency, x is the position of the scanning position, and $A_a$ is a material removal layer corresponding to an equalized dwell time $A_a/B$; and 3.2) selecting an operating velocity V of the machine tool that meets t=L/V, for t>T, wherein, L is a size into which the mesh of the component is subdivided, and T is the dwell time of the ion beam machining.

* * * * *